United States Patent [19]

Chen

[11] 4,094,005

[45] June 6, 1978

[54] MAGNETIC BUBBLE DATA TRANSFER SWITCH

[75] Inventor: Thomas T. Chen, Yorba Linda, Calif.

[73] Assignee: Rockwell International Corporation, El Segundo, Calif.

[21] Appl. No.: 688,651

[22] Filed: May 21, 1976

[51] Int. Cl.$^2$ .............................................. G11C 19/08
[52] U.S. Cl. ......................................... 365/16; 365/43
[58] Field of Search ................... 340/174 TF; 365/13, 365/16

[56] References Cited

U.S. PATENT DOCUMENTS

| | | | |
|---|---|---|---|
| 3,713,116 | 1/1973 | Bonyhard et al. | 340/174 TF |
| 3,714,639 | 1/1973 | Kish et al. | 340/174 TF |
| 4,007,453 | 2/1977 | Bonyhard et al. | 340/174 TF |

OTHER PUBLICATIONS

AIP Conference Proceedings, Magnetism & Magnetic Materials No. 24, 1974, pp. 641–642.

Primary Examiner—James W. Moffitt
Attorney, Agent, or Firm—H. Fredrick Hamann; G. Donald Weber, Jr.

[57] ABSTRACT

A switch device which is disposed between adjacent magnetic bubble domain propagation paths to permit selective, substantially concurrent, exchange of information (i.e. magnetic bubble domains) from one path to the other. The switch is a unique arrangement of substantially conventional components which are selectively activated by application of a current through a control conductor. In one condition, the magnetic bubble domains propagate through the respective paths in the normal manner. In another condition, as a function of the control current supplied to the conductor, the bubbles are exchanged (simultaneously transferred) between the respective paths. In yet another condition, the bubbles in one path are replicated and supplied to another path.

13 Claims, 9 Drawing Figures

BY-PASS MODE

CROSSOVER MODE

REPLICATE MODE

MAGNETIC BUBBLE DATA TRANSFER SWITCH

BACKGROUND

1. Field of the Invention

This invention is directed to magnetic bubble domain devices, in general, and to switch circuits for use in magnetic bubble domain circuits, in particular.

2. Prior Art

With the advent of magnetic bubble domains and the circuits and devices utilizing same, more and better systems are being developed. These systems are being developed to promote superior throughput capability as well as to provide greater flexibility and, therefore, improved utilization of chip organization.

Many approaches have been taken to develop such chip organizations with a maximum of capability. Generally, a chip organization, such as major/minor loop or the like, frequently requires flexibility in the system structure which is achieved by permitting selective interchange of information between various components.

In order to facilitate an improved system operation, improved substructures and components are also being developed. For example, transfer switches, such as the dollar sign ($) switch have been developed to improve bubble domain circuit operation. However, transfer switches, such as those noted, generally have the shortcoming that a transfer is permissible in only one direction at a time. Consequently, the transfer process is slow and tedious as well as requiring large portions of chip geometry and system architecture, especially if large data capacity is required. Consequently, it is desirable to improve this portion of bubble domain structure configurations to permit improved system operation.

SUMMARY OF THE INVENTION

This invention provides an active exchange switch whereby information is propagated along separate paths or is exchanged between adjacent propagation paths, or replicated relative to one path and transferred to another path. The switches are arranged to permit information to be manipulated and exchanged without encountering timing problems between the information streams in the respective propagation paths. The individual components of the switches are generally conventional components wherein unusual technology is not required.

DESCRIPTION OF A PREFERRED EMBODIMENT

Figure 1A:
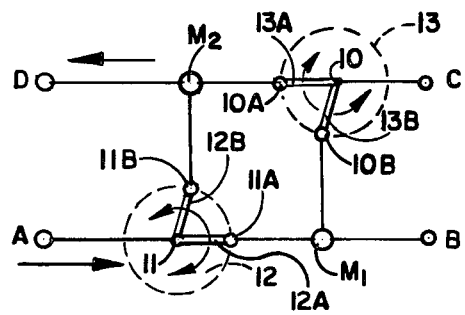
FIGS. 1A through 1D are schematic representations of a switch in different operating modes.
Figure 1B:
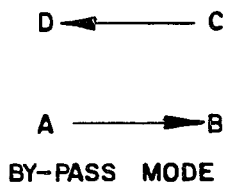
Figure 1C:
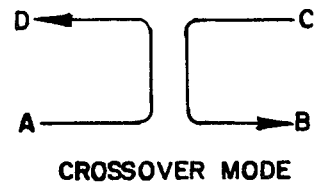
Figure 1D:
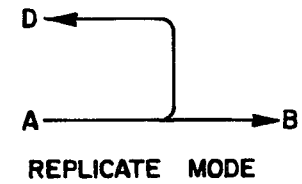

As a matter of explanation, it should be noted that the circuit diagram suggested in FIG. 1A is generically referred to as a "double switch". By double switch is meant a pair of substantially similar switches which are utilized to selectively interconnect two adjacent propagation paths as shown in FIG. 1A. In operation of the double switch, each of the switches has several possible functions. For example, the switches function to propagate information in the normal or "by-pass" mode. The double switch also functions as an "exchange switch" when in the "cross-over" mode. An exchange switch, in the context of this application, is a pair of switches which transfers information therethrough. With a pair of such switches arranged to cooperate in tandem, information from one propagation path is exchanged with the information in a different propagation path. This permits a "one-for-one" exchange of information in adjacent paths.

In the "replicate" mode, information in one path is propagated along that path and replicated and supplied to the other path as well. This operation permits nondestructive readout of the information in the first path and the transfer thereof to another path for operation.

A "universal" switch is a switch which is capable of performing both the exchange and replicate functions. The type of switch which is provided is determined by the component structure thereof.

These switches can be fabricated using existing technology. As well, existing or conventional elements such as the dollar sign ($), twisted-H, chevron or half-disc, can be utilized in constructing the switches.

FIGS. 1A through 1D are schematic representations of magnetic bubble domain switches of the instant invention. Locations A, B, C and D represent the same locations in each figure. As shown in FIG. 1A, switches 12 and 13 are represented as double-pole rotary switches. That is, switch 12 includes poles 12A and 12B which, as shown, interconnect node 11 to nodes 11A and 11B. As discussed infra, this switch condition permits replicate operation as suggested in FIG. 1D. Switch 12 can be selectively altered to interconnect node 11 to either node 11A or node 11B to permit bypass or cross-over operation, respectively. Switch 13 functions similarly to switch 12. By controlling the operations of switches 12 and 13, the switch function is controlled. Generally, switch 12 selectively interconnects location A to location B while switch 13 selectively interconnects location C to location D. Conversely, switch 12, when activated, interconnects location A to location D and switch 13 interconnects location C to location B. In some conditions, location A is connected to locations B and D or location C is connected to locations B and D. When switches 12 and 13 are in the normal (unactivated) condition, the exchange switches are in the "bypass" mode such as is suggested in FIG. 1B. In this condition, node 11 is connected to node 11A by pole 12B and node 11B is floating. Likewise, node 10 is connected to node 10A by pole 13B and node 10B is floating. Conversely, when switches 12 and 13 are activated, the switch is in the "cross-over" mode as suggested in FIG. 1C. In this condition, node 11 is connected to node 11B by pole 12A while node 11A is floating. Likewise, node 10 is connected to node 10B by pole 13A while node 10A is floating.

In the "replicate" mode, either switch 12 or switch 13 is in the state shown in FIG. 1A and the other switch is in the totally open state or, more likely, the second switch is in the "by-pass" mode and no information is supplied to the "non-replicating" switch. For example, if switch 12 is to replicate (as shown in FIG. 1A), nodes 10A and 10B must be disconnected from node 10 or location C must not supply any bubble information.

The switches, as shown in FIG. 1A, include merge components M1 and M2, respectively. The merge components are desirable in order to permit the bubbles from location A to be merged into the propagation path associated with location D or to permit bubbles from location C to be merged into the propagation path associated with location B when appropriate. The merge components are considered to be portions of the switches as described infra.

Figure 2:
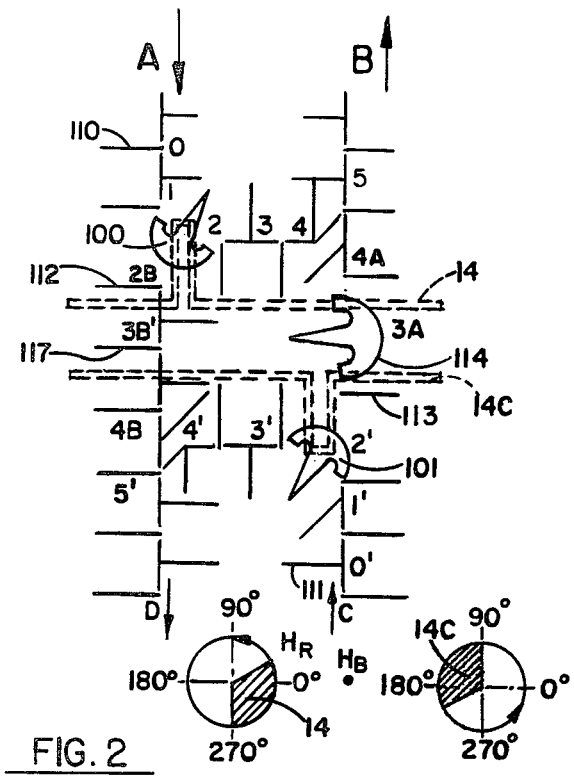
FIG. 2 is a schematic representation of one embodiment of the instant invention referred to as a universal switch.

Referring now to FIG. 2, there is shown one embodiment of a double switch design which operates as a universal switch. That is, the switch is capable of transfer, exchange or replicate functions. In this embodiment, the first path AB follows bubble locations 0, 1, 2, 3, 4, 5. In addition, the path CD comprises the bubble locations 0', 1', 2', 3', 4', 5'. The propagation paths generally incorporate typical and known component structures such as T-bars and I-bars. However, it is seen that each propagation path includes a "fat-T" or "half-disc" element. These elements are incorporated into the propagation paths to permit bubbles to be transferred from location 1 to location 2 (in path AB) and from location 2' to location 3' (in path CD).

The double switch component design is arranged so that the basic holding positions (locations) are defined in terms of those positions which the bubbles assume when the rotating field $H_R$ is in the 0° or right-pointing state. Thus, the bubble in path AB assumes locations 0 at the end of I-bar 110 while the 0' position in the path CD is achieved at the end of the horizontal member of T-bar 111. With a full revolution of the rotating field, the bubbles have moved to location 1 and 1', respectively. Likewise, with a further revolution of the rotating field $H_R$, the bubbles have moved to locations 2 and 2', respectively. It must be noted that the bubble in path AB which is located at location 2 has completely traversed the outer periphery of the curved portion of fat-T 100 while the bubble at the 2' location in path CD has only begun to extend along the outer periphery of the circular portion of fat-T element 101. Nevertheless, with three more complete revolutions of the rotating field $H_R$, the bubbles in path AB assume locations 3, 4 and 5, consecutively. Likewise, the bubbles in path CD assume the positions 3', 4' and 5', consecutively. As the field $H_R$ continues to rotate, the bubbles continue to propagate through the respective paths without incident. This is the equivalent of the "by-pass" mode of operation described supra relative to FIG. 1B. In this situation, no control current signals are supplied to conductors 14 or 14C at the critical moments.

If now the "cross-over" or exchange mode of operation is desired, it is noted that the field $H_R$ and $H_B$ are applied to the device. However, a control current is supplied to conductor 14 shortly after the bubble is transferred from location 1 (I-bar 110) to the adjacent end of fat-T 100. That is, when rotating field $H_R$ reaches the 90° position, the bubble at location 1 is transferred to the left-most end of element 100. As rotating field $H_R$ continues to rotate, the bubble strips-out slightly and extends around the edge of element 100. When the control current is supplied to conductor 14 in the proper direction, a magnetic field is generated thereby which essentially prevents the bubble from stripping out along the periphery of the element 100. This field causes the bubble to stretch along conductor 14 until rotating field $H_R$ reaches the 0° condition. Under these conditions, the bubble assumes location 2B at the right end of I-bar 112. The control current in conductor 14 is then terminated wherein, as rotating field $H_R$ continues to rotate, the bubble assumes positions 3B', 4B and 5', consecutively. Similarly, in this cross-over mode, when a bubble in the path CD has reached the 2' position, (essentially the 270° position of the rotating field), a control current is supplied along conductor 14C. The control current has the effect of blocking the bubble at element 101 from propagating around the edge thereof. However, the bubble propagates along conductor 14C and is transferred to I-bar 113 when $H_R$ reaches the 180° status. At this time, the control current in conductor 14C is terminated wherein, as rotating field $H_R$ continues to rotate, the bubble at I-bar 113 is transferred to fat-T element 114. The bubble propagates around element 114 and achieves positions 3A, 4A and 5, consecutively.

Thus, bubbles are transferred from A to D and from C to B concurrently. If no additional control currents are applied to conductors 14 and 14C, the bubbles will return to propagating through the paths AB and CD, respectively.

In the cross-over mode, it is noted that the control signal applied to conductor 14 occurs approximately one half cycle of rotating field $H_R$ prior to the application of a control signal to conductor 14C. This situation is dictated by the structure of the propagation paths as related to the rotating field. That is, the bubble is transferred from location 1 to an edge of fat-T element 100 in approximately 90° rotation of $H_R$. The bubble at location 1' requires approximately 270° rotation of $H_R$. The propagation path from element 100 to the remaining propagation path AB comprises two I-bars and, effectively, two T-bars. The same number of components are interposed between fat-T element 101 and the remainder of path CD. However, in the cross-over mode, it is seen that a bubble from location 1 on the way to location 2B is already in the cross-over mode path while the bubble at 2' is still in the original propagation path. Consequently, a propagation path including locations 3B' and 4B is inserted between locations 2B and 5'. In order to maintain synchronism in the pulses, fat-T element 114 is interposed into the cross-over path whereby the bubble at location 2' will assume locations 3A and 4A within two revolutions of the rotational field wherein the bubble is now, in effect, at the same location as the bubble at location 4B so that in the next revolution of rotational field $H_R$, the bubbles achieve locations 5 and 5', respectively, in synchronism with the other bubbles propagating through paths AB and CD, respectively.

In order to establish the replicate function, the cross-over mode of operation described supra is followed. However, in the replicate mode no information is supplied along one of the propagation lines. For example, assume that path AB represents a portion of a loop while path CD represents the other propagation path. If information is to be replicated from loop AB to path CD, it is essential that no information be applied along the propagation path from location C. In this instance, the bubble is stretched along the periphery of element 100. The magnetic field produced by the current signal applied on conductor 14 has the effect of causing the portion of the bubble at the left-side of fat-T (or half-disc) element 100 to stretch toward location 2B. Also, the magnetic field produced by the current signal on conductor 14 has the effect of severing the right-end portion of the bubble on element 100. When the current signal is then removed, separate bubbles proceed to locations 3 and 3B′ under the influence of rotating field $H_R$. Thus, the bubble is stretched and a current signal is supplied to conductor 14 to sever the bubble into two parts. One part of the severed bubble continues to propagate to location B and the other (new) bubble propagates to location D. Inasmuch as no information is supplied from location C, the replicate function and NDRO has been achieved.

While not essential, it is possible that information may be removed from location C in any manner. For example, it is considered possible that an annihilator cam be associated with this location wherein any bubbles in that path could be annihilated concurrent with the signal supplied along path 14. This latter structural arrangement is not shown in the drawings.

Figure 3:
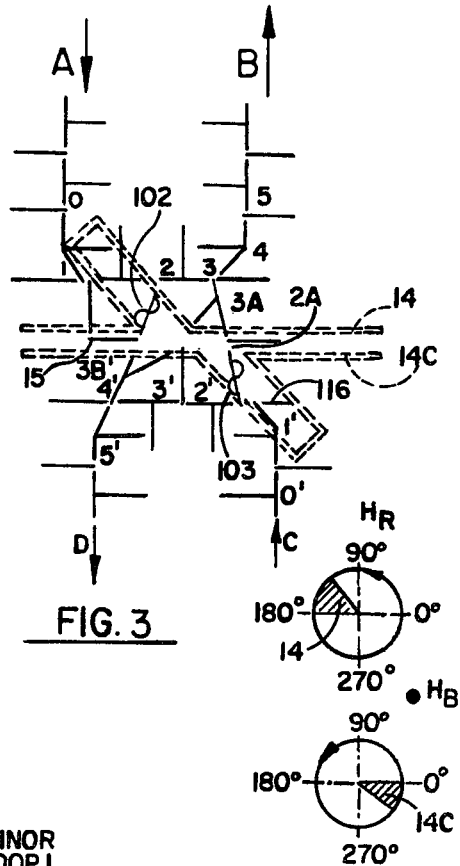
FIG. 3 is a schematic representation of another embodiment of the instant invention referred to as an exchange switch.

Referring now to FIG. 3, there is shown another embodiment of the double switch component. However, the structure of this switch permits only an exchange function. Again, a pair of propagation paths AB and CD are described. In path AB, the bubble consecutively assumes locations 0, 1, 2, 3, 4 and 5. Likewise, in the CD path, the bubble consecutively assumes locations 0′, 1′, 2′, 3′, 4′ and 5′. In principle, the operation of the circuit embodiment shown in FIG. 3 is similar to the operation of the embodiment shown in FIG. 2. However, transfer switches in the form of dollar sign ($) switches 102 and 103 are used to transfer information during the cross-over mode. These switches, generally, are capable of unidirectional operation at any instant. To transfer information from location A to location D, a control current is supplied to conductor 14 shortly after the rotating field $H_R$ has reached the 135° position but prior to reaching the 180° position. Thus, the bubble is forced to propagate along the dollar sign component 102 toward the lower end thereof in FIG. 3. By terminating the control current signal in conductor 14 at approximately the 225° position of $H_R$, the bubble is permitted to propagate to the end of element 102 and, subsequently, to location 3B′ at the right end of I-bar 15. The bubble continues to propagate under the influence of $H_R$ along the skewed T-bar component until it reaches location 4′ and subsequently location 5′. Likewise, a bubble is propagating from location C to location B. After the bubble reaches location 1′ it will be propagated to the left end of I-bar 116 and, thence, to the lower end of transfer switch 103. At this time, i.e. approximately 315° of $H_R$, a control current is supplied to conductor 14C to prevent the bubble from transferring to location 2′. Rather, the bubble propagates through element 103 to location 2A. Again, under the influence of $H_R$ the bubble propagates consecutively to locations 3A, 4 and 5 in a normal manner.

In the embodiment shown in FIG. 3, because of the operation of the component in response to rotating field $H_R$, it is seen that only a single T-bar element is disposed between the cross-over elements in path AB. Conversely, two T-bars and an I-bar are located between the cross-over elements in path CD. The additional T-bar and the I-bar provide one additional operational cycle for rotation of $H_R$ in path CD so that a bubble traversing the cross-over path (including transfer switch 102) arrives at location 4′ concurrent with the space provided when the bubble in path CD has been propagated through and toward location B. These spacings and the appropriate number of elements or components in the respective paths are important to preserve synchronism of bubbles propagating through the respective paths so that information is properly stored and so that a minimum length propagation path is permitted.

Figure 4:
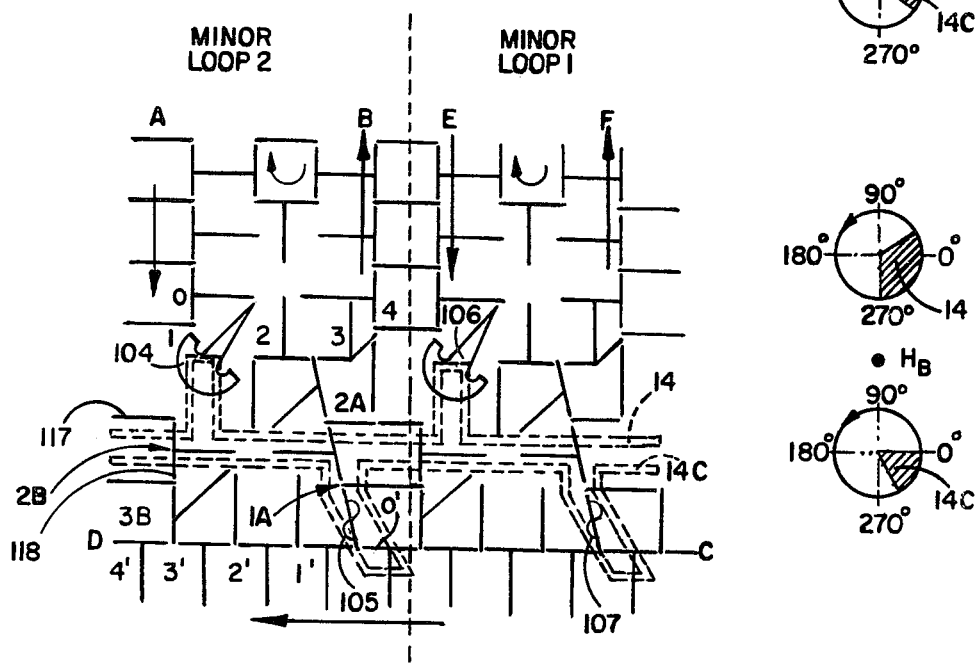
FIG. 4 is a schematic representation of another embodiment of the instant invention which combines features of both the universal and the exchange switch.

Referring now to FIG. 4, there is shown another embodiment of the exchange switch. This exchange switch is shown in a major path/minor loop arrangement but can be utilized in the configurations shown in FIGS. 2 and 3. The rest locations for bubbles are defined in terms of $H_R$ pointing to the left in FIG. 4. Bubbles propagating along path CD follow locations 0′, 1′, 2′, 3′ and 4′. Meanwhile, bubbles propagating through loop AB follow locations 0, 1, 2, 3 and 4. The aforesaid paths are followed in response to the rotation of field $H_R$ and in the absence of the application of a control signal along control conductor 14. However, with the application of a control current along conductor 14, at the appropriate time the bubble propagating along the CD path is transferred from location 0′ to the lower end portion of ($) transfer switch 105. The application of the control current, when $H_R$ is at approximately 315°, effectively blocks the bubble from transferring to the next T-bar and causes the bubble to propagate through transfer element 105 toward location 1A. In response to field $H_R$, the bubble propagates from location 1A, to location 2A, and to locations 3 and 4 wherein a bubble from location C is transferred to location B. Likewise, a bubble from location 0 propagates through and reaches location 1. At the appropriate time, the control current is supplied along conductor 14 to prevent the bubble at location 1 from stripping out and stretching along the outer periphery of the fat-T element 104. In addition, the magnetic field established by conductor 14 adjacent element 104 causes the bubble to stretch toward I-bar 117 and, thence, to T-bar 118 at which point location 2B is established. In response to the rotating field $H_R$, the bubble propagates to locations 3B and 4, consecutively. Thus, a bubble has been transferred from location A to location D.

Figure 5:
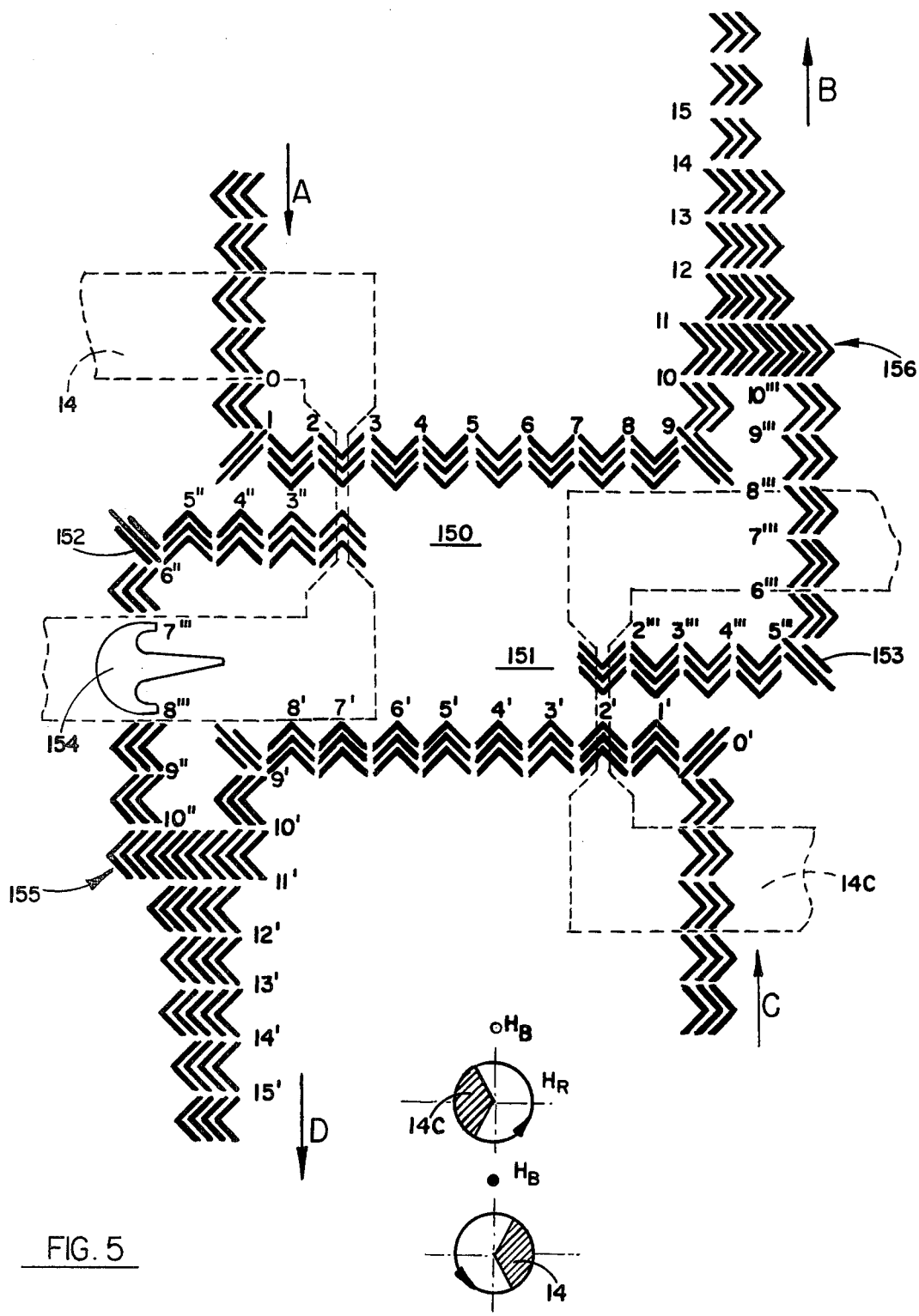
FIG. 5 is a schematic representation of another embodiment of a universal switch.

Referring now to FIG. 5, there is shown another embodiment of the instant invention. The switch embodiment shown in FIG. 5 is a universal switch which uses two-level chevron transfer/replicate switches 150 and 151. Switches 150 and 151 are known type switches comprising opposed chevron columns which form portions of adjacent propagation paths. A portion of conductor 14 is disposed over the apices of the chevron columns. This type of two level switch has been described by I. S. Gergis et al., in paper 3A-6 entitled "A Compact Transfer/Replicate Switch for Field Access Bubble Devices", presented at the 3M Conference at Philadelphia, Pennsylvania, in 1975. A similar device using single level techniques has been described by T. J. Nelson.

The adjacent paths comprise paths AB and CD as described supra. However, the paths comprise chevron structures rather than T-bars and I-bar structures. In a typical operation, the bubble will propagate along the respective propagation paths from A to B or from C to D in response to the rotating field $H_R$.

Utilizing switches 150 and 151, the desired transfer or replicate operation can be accomplished. The operation of the switches is described in the aforementioned Gergis or Nelson publications which are incorporated herein by reference. Thus, a detailed description of the operation of switches 150 and 151 is unnecessary. Suffice it to say, that depending upon the application of control current signals to conductor 14 and/or conductor 14C, a bubble from location A may be propagated along the propagation path toward B and, concurrently to D in response to a replication operation. Similarly, a bubble from C may be propagated to D and/or B in accordance with the transfer or replicate operation of switch 151.

It should be noted that bubble rest locations in various propagation paths are enumerated. For example, the bubble locations at the end of respective full cycles of $H_R$ are listed from 0 to 15. These locations define the propagation of a bubble from A to B in the standard operating fashion. Likewise, bubble locations 0' through 15' represent the typical propagation path of bubbles from C to D under normal circumstances. However, if switch 150 is in the transfer mode, a bubble will follow the path 0, 1, 2, 3'', 4'' and so forth. Of course, if switch 150 is in a replicate mode, separate bubbles will be generated which will move from location 2 to locations 3 and 3'' and thence to 4, 5, 6 and 4'', 5'' and 6'', respectively. Similar functions occur with respect to switch 151. Thus, a bubble may selectively be transferred from location 2' to location 3' and/or location 3'''.

Moreover, it is noted that the fat-T element 154 is inserted between location 7'' and 8''. This fat-T element permits the bubble to be transferred from location 7' to location 8' within one rotation of field $H_R$. This operation permits a bubble from switch 150 to propagate along the path comprising locations 3'', 4'' and so forth through corner 152 to arrive at location 9'' in synchronism with the space for a bubble which would have arrived at location 9'. Thus, the bubble reaches location 10'' fully synchronized with location 10' and synchronism is not lost in the system. Thus, bubbles arriving at merge 155 are in synchronism regardless of whether they follow the prime (') or double prime ('') path. The purpose in utilizing fat-T element 154 is seen in the fact that there are five chevron columns interposed between corner 153 and merge 156. If five such chevron columns were interposed between corner 152 and merge 155, synchronism between the AB and CD lines would be lost. Conversely, if a single chevron element were utilized in place of fat-T element 154 and an undesirable gap or spacing in the information would occur in the path between corner 152 and merge 155. Thus, utilization of the fat-T element permits the double switch concept to be utilized to provide the universal switch configuration.

Figure 6:
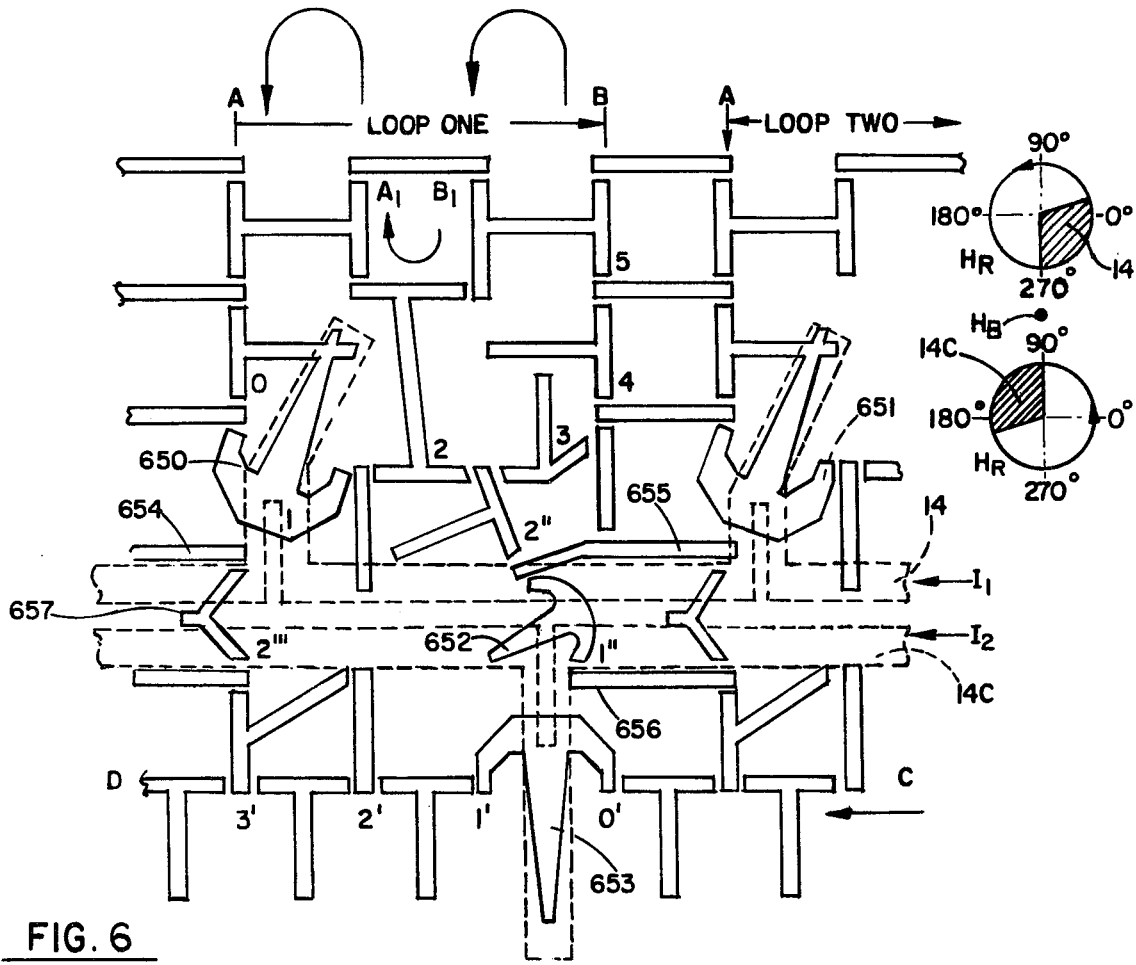
FIG. 6 is a schematic representation of another embodiment of a universal switch.

Referring now to FIG. 6, there is shown another embodiment of a universal switch. Again, paths AB and CD represent adjacent propagation paths for magnetic bubbles. It should be considered that path AB comprises a loop which is folded in upon itself as suggested by the arrow B1–A1. That is, A1 is adjacent to location A while location B1 is adjacent location B. This internal convolution of the loop is not essential to the overall circuit operation.

In this embodiment, the propagation paths are generally of T-Bar, I-bar and H-bar type. In standard operation, i.e. without the application of a current signal $I_1$ at conductor 14, the bubble follows the location paths defined by locations 0, 1, 2, 3, 4 and 5. Likewise, the bubble in path CD follows the locations 0', 1', 2', 3' and so forth. It is seen that moving from locations 0 to location 2 through location 1, the bubble is transferred around the outer periphery of anchor element 650. Actually, half-disc element 650 is very similar to a fat-T (half disc) element described supra with a modified peripheral edge which is more angular. Likewise, the bubble propagating along the path CD traverses the outer periphery of the edge of anchor element 653.

In the transfer or exchange mode, signals are supplied along conductor 14 and 14C wherein a bubble is transferred from location 0 or 0' to the outer periphery of half-disc elements 650 and 653, respectively. However, the current signal is supplied before the bubble has arrived at that location defined by the conductor. Consequently, the current supplied along the respective conductor blocks the bubble at the anchor element and effectively causes the bubble to extend along the conductor. For example, the bubble at location 0 is transferred to half-disc element 650 in response to rotating field $H_R$. Shortly after the bubble is transferred to the half-disc element 650, a control signal is supplied along conductor 14 wherein the bubble is blocked by this conductor, extends therealong and is transferred to I-bar 654. Similarly, a bubble at location 0' is blocked and extended along conductor 14C with the application of the control signal. This bubble is then transferred to I-bar 656 and thence to location 1'' at the end of half-disc element 652. Of course, at that point, the current in conductor 14C has been terminated. Thence, in response to rotating field $H_R$, the bubble at I-bar 654 is transferred to Y-bar 657 and transferred to location 2''' and, thence, to location 3'. Similarly, the bubble at location 1'' of half-disc element 652 is transferred around the periphery of half-disc 652 and ultimately attracted to the left-end of I-bar 655 and, thence, to location 2'' where it is transferred to location 3.

It is seen that in this arrangement, bubbles are transferred from path AB to path CD and vice versa in synchronism wherein a fully synchronized exchange function occurs.

If a replicate function is desired, the same general operation is performed. However, the current control signal or cutting pulse is applied to conductor 14, for example, after the bubble strip has stretched around the periphery of the half-disc element 650. Thus, the bubble is split into two portions, one portion being stretched along conductor 14 between elements 650 and 654 as described supra. The other portion of the bubble continues to propagate along the right edge of the half-disc element 650 and, thence, through the propagation path to location 2 as in the normal mode of operation. Thus, a fully synchronized arrangement produces bubbles from location A to location B and to location D. Of course, it must be noted that in this circumstance either no information is propagated from location C or any information therein is annihilated by any suitable means, not shown. Again, it is noted relative to other switch devices, half-disc element 652 permits transfer of bubbles from location 1'' to location 2'' within a single cycle of rotating field $H_R$ wherein, along with the arrangement of the other devices, synchronism is maintained between the two paths.

Thus, there have been shown and described preferred embodiments of the instant invention. In these embodiments, there is shown a magnetic bubble domain switch wherein information can be transferred from one propagation path to another in such a manner as to permit synchronism of information in each path. Thus, information in increments as small as a single bubble can be selectively transferred and/or exchanged between adjacent propagation paths. It should be understood that those skilled in the art may conceive modifications to the instant invention. However, any such modifications which fall within the purview of the instant description are intended to be included herein as well. For example, it is considered likely that those skilled in the art may conceive switch components wherein the individual device component configurations may be slightly altered. Also, it is conceivable that the propagation paths may comprise rows or columns of chevrons in place of the I-bar and T-bar propagation paths. In addition, other modifications may become apparent wherein modified versions of the fat-T, $, or other similar elements may be designed and included in the switch configuration. In addition, certain of the T-bar shapes which are shown as modified T-bars may be incorporated and the specific modified or twisted T-bars or H-bars or the like may be replaced. However, so long as the functional equivalency is retained, this description is intended to incorporate such modifications.

Having thus described a preferred embodiment of the invention, what is claimed is:

1. An active data switch for magnetic bubble domain systems comprising:
   first and second propagation paths;
   each of said first and second propagation paths comprising a plurality of passive components;
   first and second transfer switch means interposed between said first and second propagation paths;
   said first and second transfer switch means forming portions of said first and second propagation paths,
   said first and second transfer switch means arranged such that the distance therebetween is different in said first and second propagation paths;
   conductor means associated with said first and second transfer switch means to selectively control the operation of said first and second transfer switch means whereby said first and second propagation paths are selectively interconnected by at least one of said first and second transfer switch means during one operating cycle.

2. The active data switch recited in claim 1 wherein said first and second transfer switch means are arranged such that the distance therebetween is less in said first propagation path than in said second propagation path.

3. The active data switch recited in claim 1 wherein said first and second transfer switch means include components which permit formation of strip magnetic bubble domains such that synchronization of propagation of information transferred from said first and second propagation paths is effected.

4. The active data switch recited in claim 1 wherein, said distance between said first and second transfer switch means is measured in terms of operating cycles.

5. The active data switch recited in claim 1 wherein, said first propagation path comprises a minor loop and said second propagation path comprises a major loop.

6. The active data switch recited in claim 1 wherein, at least one of said first and second propagation paths comprise a closed storage loop.

7. The active data switch recited in claim 1 wherein, said first and second transfer switch means are interposed between said first and second propagation paths to form separate interconnecting paths therebetween.

8. A magnetic arrangement which permits the synchronized interchange of magnetic bubble domains between two magnetic propagation paths,
   first and second paths for defining and controlling the movement of magnetic bubble domains in response to cyclic magnetic field stimulus,
   first and second ports for selectively interconnecting said first and second paths in response to control signals and transferring bubble domains between said first and second paths,
   first and second conductor means associated with said first and second ports, respectively, for providing said control signals,
   means for supplying first and second control signals to said first and second conductors, respectively, during one cycle of said cyclic magnetic field, and
   a timing adjustment member associated with at least one of said first and second ports for adjusting the transfer of bubble domains between said first and second paths in order to maintain synchronism of bubble domain movement in both of said first and second paths concurrently.

9. The magnetic arrangement recited in claim 8 wherein at least one of said first and second ports includes half-disk-like devices.

10. The magnetic arrangement recited in claim 8 wherein at least one of said first and second ports includes dollar sign ($) devices.

11. The magnetic arrangement recited in claim 8 including material for supporting magnetic bubble domains which define the information to be switched.

12. The magnetic arrangement recited in claim 8 wherein said first and second paths include passive components which are in the form of I-bars, T-bars, H-bars, Y-bars, chevrons and combinations thereof.

13. The magnetic arrangement recited in claim 8 wherein each said first and second port includes a connector component which forms a portion of the adjacent one of said first and second paths in the absence of the application of a signal to the associated one of said first and second conductor means.

* * * * *